US008951915B2

(12) United States Patent
Hess et al.

(10) Patent No.: US 8,951,915 B2
(45) Date of Patent: Feb. 10, 2015

(54) METHODS FOR MANUFACTURING A CHIP ARRANGEMENT, METHODS FOR MANUFACTURING A CHIP PACKAGE, A CHIP PACKAGE AND CHIP ARRANGEMENTS

(75) Inventors: Reinhard Hess, Straubing (DE); Katharina Umminger, Lappersdorf (DE); Gabriel Maier, Regensburg (DE); Markus Menath, Regensburg (DE); Gunther Mackh, Neumarkt (DE); Hannes Eder, Villach (AT); Alexander Heinrich, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 13/609,306

(22) Filed: Sep. 11, 2012

(65) Prior Publication Data
US 2014/0070376 A1 Mar. 13, 2014

(51) Int. Cl.
*H01L 21/44* (2006.01)
(52) U.S. Cl.
USPC .................... 438/667; 438/694; 257/E29.002
(58) Field of Classification Search
CPC .................... H01L 21/76898; H01L 21/30655
USPC .................................................. 438/667, 694
See application file for complete search history.

(56) References Cited

U.S. PATENT DOCUMENTS

| 5,501,893 A | 3/1996 | Laermer et al. |
| 2010/0171223 A1* | 7/2010 | Kuo et al. ..................... 257/773 |

OTHER PUBLICATIONS

Applied materials silicon technologies, Because innovation matters. "Through-Silicon Via 3D Integration", Applied Materials, Inc., 5 pages.

* cited by examiner

*Primary Examiner* — Alexander Ghyka

(57) ABSTRACT

A method for manufacturing a chip arrangement is provided, the method including: forming a hole in a carrier including at least one chip, wherein forming a hole in the carrier includes: selectively removing carrier material, thereby forming a cavity in the carrier, forming passivation material over one or more cavity walls exposed by the selective removal of the carrier material; selectively removing a portion of the passivation material and further carrier material exposed by the selective removal of the passivation material, wherein a further portion of the passivation material remains over at least one cavity side wall; the method further including subsequently forming a layer over the further portion of passivation material remaining over the at least one cavity side wall.

14 Claims, 12 Drawing Sheets

FIG 1 ~ 100 forming a hole in a carrier including at least one chip, wherein forming a hole in the carrier includes: selectively removing carrier material, thereby forming a cavity in the carrier, forming passivation material over one or more cavity walls exposed by the selective removal of the carrier material; and selectively removing a portion of the passivation material and further carrier material exposed by the selective removal of the passivation material, wherein a further portion of the passivation material remains over at least one cavity side wall; ~ 110 subsequently forming a layer over the further portion of passivation material remaining over the at least one cavity side wall. ~ 120

210 — individualizing a plurality of chips from a carrier including the plurality of chips, wherein individualizing the plurality of chips includes:
removing carrier material between the plurality of chips at a carrier surface;
forming passivation material over portions of the carrier exposed by the removal of carrier material, and etching at least one portion of the passivation material and carrier material exposed by the etching of the at least one portion of passivation material;
wherein remaining passivation material protects side walls of the plurality of chips from the etching;

220 — forming at least one layer over the remaining passivation material; the at least one layer and the remaining passivation material forming part of the chip package.

FIG 3

~ 300 removing carrier material from at least one region between a plurality of chips from a carrier including the plurality of chips to separate the plurality of chips; wherein removing the carrier material includes:
alternating between forming passivation material over portions of the carrier exposed by the removal of carrier material, and a removal process which selectively removes a portion of the passivation material and further carrier material exposed by the selective removal of the passivation material, wherein passivation material not removed by the removal process is formed over the side walls of the plurality of chips;

~ 310 forming at least one layer over passivation material that remains after the plurality of chips have been separated; the at least one layer and the remaining passivation material forming part of the chip package.

410 forming a channel through a carrier including a first chip and a second chip, the channel separating the first chip from the second chip, wherein forming the channel through the carrier includes: forming a channel opening by selectively removing carrier material between the first chip and the second chip; and alternating between forming passivation material over portions of the carrier exposed by the selective removal of carrier material, and selectively removing a portion of the passivation material and further carrier material exposed by the selective removal of the passivation material, wherein a further portion of the passivation material remains over side walls of the channel; until the channel is formed through the carrier; wherein the passivation material remaining over side walls of the channel formed through the carrier is thickened to a thickness of at least about 100 nm.

METHODS FOR MANUFACTURING A CHIP ARRANGEMENT, METHODS FOR MANUFACTURING A CHIP PACKAGE, A CHIP PACKAGE AND CHIP ARRANGEMENTS

TECHNICAL FIELD

Various embodiments relate generally to methods for manufacturing a chip arrangement, methods for manufacturing a chip package, a chip package and chip arrangements.

BACKGROUND

Up till now, no productive methods have been used to manufacture a side wall passivation after the individualization of the chips. Any methods associated with side wall passivation, such as oxide deposition, may be complex.

An etch method, such as the so-called Bosch process may be used for etching away unwanted portions of a wafer substrate. A Bosch process is described in Laermer et al., "Method of anisotropically etching silicon" U.S. Pat. No. 5,501,893 granted Mar. 26, 1996, the content of which is hereby incorporated by reference in its entirety. During the Bosch process, a polymer layer may be deposited on the floor and on a side wall of a chip. Following which, an etch process may be carried out wherein the polymer layer on the floor may be fully removed, and the polymer layer on the side wall may be partially thinned. The etching and polymerization process may be alternatingly repeated.

SUMMARY

Various embodiments provide a method for manufacturing a chip arrangement, the method including: forming a hole in a carrier including at least one chip, wherein forming a hole in the carrier includes: selectively removing carrier material, thereby forming a cavity in the carrier, forming passivation material over one or more cavity walls exposed by the selective removal of the carrier material; selectively removing a portion of the passivation material and further carrier material exposed by the selective removal of the passivation material, wherein a further portion of the passivation material remains over at least one cavity side wall; the method further including subsequently forming a layer over the further portion of passivation material remaining over the at least one cavity side wall.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing a chip arrangement according to an embodiment;

FIG. 2 shows a method for manufacturing a chip package according to an embodiment;

FIG. 3 shows a method for manufacturing a chip package according to an embodiment;

FIG. 4 shows a method for manufacturing a chip arrangement according to an embodiment;

DETAILED DESCRIPTION

Figure 5A:
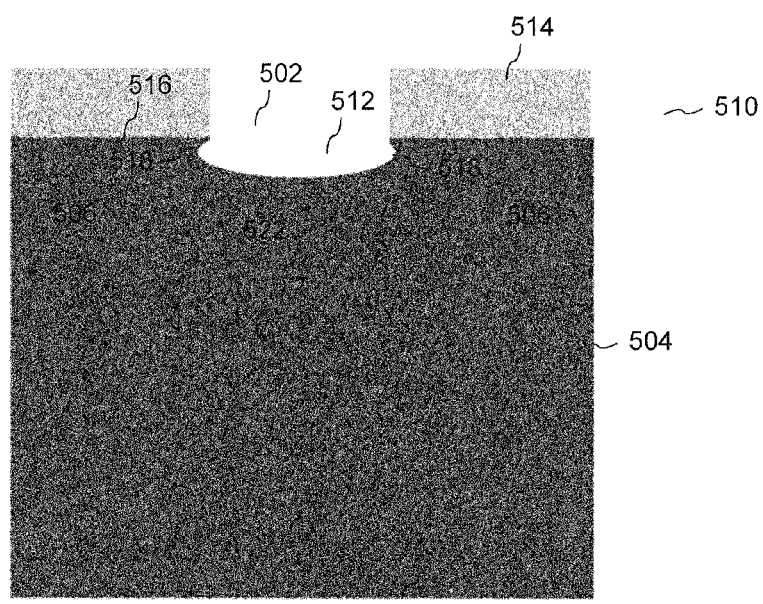
FIGS. 5A to 5F show cross-sectional views illustrating a method for manufacturing a chip arrangement according to an embodiment.

The following detailed description refers to the accompanying drawings that show, by way of illustration, specific details and embodiments in which the invention may be practiced.

The word "exemplary" is used herein to mean "serving as an example, instance, or illustration" or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide a method for manufacturing a chip arrangement, such as a chip package. While passivation of a chip side wall may normally include a complex deposition process, various embodiments provide a method for manufacturing a chip arrangement, e.g. a chip package, with a side wall passivation, which may not require extra process steps.

In order to achieve this, various embodiments may make use of an etching process referred to as the Bosch Process. A by-product of the Bosch process is a polymer layer. The polymer layer may be deposited over side walls of the chip. At the end of the Bosch process, e.g. after the formation of a hole, or a through-hole via, or a channel, the polymer layer may normally be etched away from the side wall, e.g. through a wet etch method, and a blank silicon surface, e.g. a blank silicon side wall may remain.

The Bosch process may be used for chip etching. For example, by means of plasma dicing, chips may be etched through a substrate, such as a semiconductor wafer, in the kerf regions. Instead of traditional mechanical methods, such as sawing and/or wafer grinding, the Bosch process may be used for etching away the kerf regions, i.e. unwanted portions, of the wafer substrate. At the end of the individualization method, for example, when the kerf regions have been removed, the polymer layer formed during the Bosch process may normally be etched away from the side walls of the chips.

According to various embodiments, it may be desirable that the chip side wall may be covered and passivated with a non-conductive layer comprising dielectric materials. According to various embodiments, passivation of chip side walls through polymerization processes may be carried out as a result of the Bosch Process. According to various embodiments, the polymer layer, which may be deposited during the Bosch process, instead of being discarded, may be used, wherein at the end of the Bosch process, the polymer deposits may be strengthened and/or deliberately thickened, to a polymer layer of the desired thickness. Furthermore, an additional polymer layer and/or layers may be deposited after the individualization of the chips.

Accordingly, various embodiments provide a method for manufacturing a chip arrangement and/or a chip package, wherein a passivation layer for chip side walls may be manufactured as a result of, or during, a Bosch process, without any additional processes. The passivation layer may form part of the resulting chip arrangement and/or chip package.

FIG. 1 shows method 100 for manufacturing a chip arrangement according to an embodiment.

Method 100 may include:
forming a hole in a carrier including at least one chip, wherein forming a hole in the carrier includes: selectively removing carrier material, thereby forming a cavity in the carrier, forming passivation material over one or more cavity walls exposed by the selective removal of the carrier material; selectively removing a portion of the passivation material and further carrier material exposed by the selective removal of the passivation material, wherein a further portion of the passivation material remains over at least one cavity side wall (in 110).

Method 100 may further include subsequently forming a layer over the further portion of passivation material remaining over the at least one cavity side wall (in 120).

FIG. 2 shows method 200 for manufacturing a chip package according to an embodiment.

Method 200 may include:
individualizing a plurality of chips from a carrier including the plurality of chips, wherein individualizing the plurality of chips includes: removing carrier material between the plurality of chips at a carrier surface; forming passivation material over portions of the carrier exposed by the removal of carrier material, and etching at least one portion of the passivation material and carrier material exposed by the etching of the at least one portion of passivation material; wherein remaining passivation material protects side walls of the plurality of chips from the etching (in 210).

Method 200 may further include forming at least one layer over the remaining passivation material; the at least one layer and the remaining passivation material forming part of the chip package (in 220).

FIG. 3 shows method 300 for manufacturing a chip package according to an embodiment.

Method 300 may include:
removing carrier material from at least one region between a plurality of chips from a carrier including the plurality of chips to separate the plurality of chips; wherein removing the carrier material includes: alternating between forming passivation material over portions of the carrier exposed by the removal of carrier material, and a removal process which selectively removes a portion of the passivation material and further carrier material exposed by the selective removal of the passivation material, wherein passivation material not removed by the removal process is formed over the side walls of the plurality of chips (in 310).

Method 300 may further include forming at least one layer over passivation material that remains after the plurality of chips have been separated; the at least one layer and the remaining passivation material forming part of the chip package.

FIG. 4 shows method 400 for manufacturing a chip arrangement according to an embodiment.

Method 400 may include:
forming a channel through a carrier including a first chip and a second chip, the channel separating the first chip from the second chip, wherein forming the channel through the carrier includes: forming a channel opening by selectively removing carrier material between the first chip and the second chip; and alternating between forming passivation material over portions of the carrier exposed by the selective removal of carrier material, and selectively removing a portion of the passivation material and further carrier material exposed by the selective removal of the passivation material, wherein a further portion of the passivation material remains over side walls of the channel; until the channel is formed through the carrier (in 410); wherein the passivation material remaining over the side walls of the channel formed through the carrier is thickened to a thickness of at least about 100 nm.

FIGS. 5A to 5E show cross-sectional views illustrating a method 500 for manufacturing a chip arrangement according to an embodiment.

As shown in FIG. 5A in a view 510, as part of a Bosch process, method 500 may include forming hole 502, e.g. a channel 502, in carrier 504 including at least one chip 506.

Carrier 504 may include or may be a semiconductor substrate. For example, carrier 504 may include or may be a silicon substrate, e.g. a silicon wafer, e.g. a silicon carbide (SiC) wafer. It may be understood that carrier 504 may include or be at least one carrier material from the following group of carrier materials, the group consisting of: Si, Ge, SiC, GaAs, GaN. Carrier 504 may include at least one chip 506 formed in carrier 504. Chip 506 may also be referred to as a die and/or a semiconductor die. According to various embodiments, at least one chip 506 may be understood to refer to one or more chips or dies, e.g. a plurality of chips or dies. According to various embodiments, carrier 504 may include one, two, three or more, or tens, or hundreds or thousands of semiconductor chips and/or dies formed in carrier 504.

Forming hole 502 in carrier 504 may include forming hole 502, for example by a Bosch process. Forming hole 502 in carrier 504 may include selectively removing carrier material, thereby forming cavity 512 in carrier 504. Carrier material may be removed from carrier 504 by forming a mask 514, which may include a photo-structured resist mask and/or hard mask, over carrier 504, e.g. over carrier top side 516. A hard mask may include for example, silicon oxide or silicon nitride or polyimide Carrier 504 may be etched using mask 514 as an etch mask.

According to various embodiments, hole 502 may be used to form a through-hole via, e.g. a through-hole through a wafer such as carrier 504, e.g. a through-silicon via (TSV). According to other embodiments, hole 502 may be used to individualize chips.

Figure 5B:
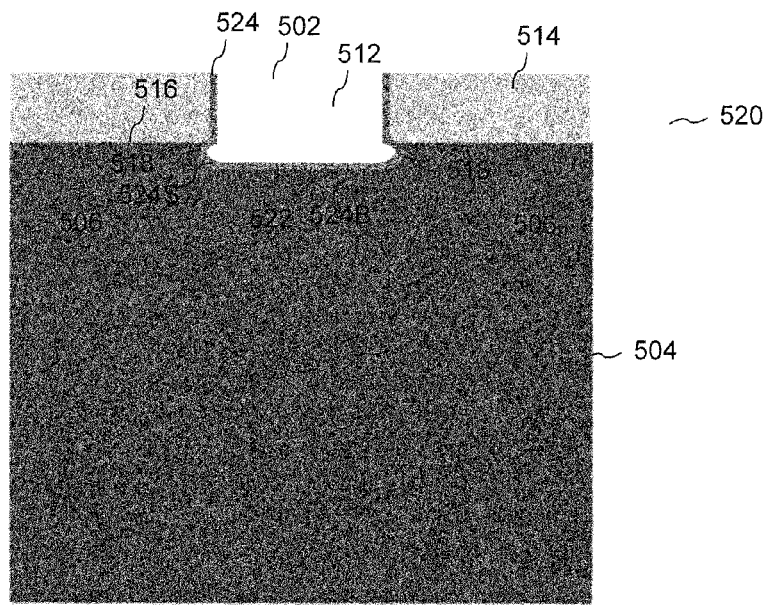

As shown in FIG. 5B in a view 520, subsequently, passivation material 524 may be formed over one or more cavity walls 518, 522 exposed by the selective removal of the carrier material illustrated in FIG. 5A. One or more cavity walls 518, 522 may include at least one cavity side wall 518 and at least one cavity bottom wall 522.

Figure 5C:
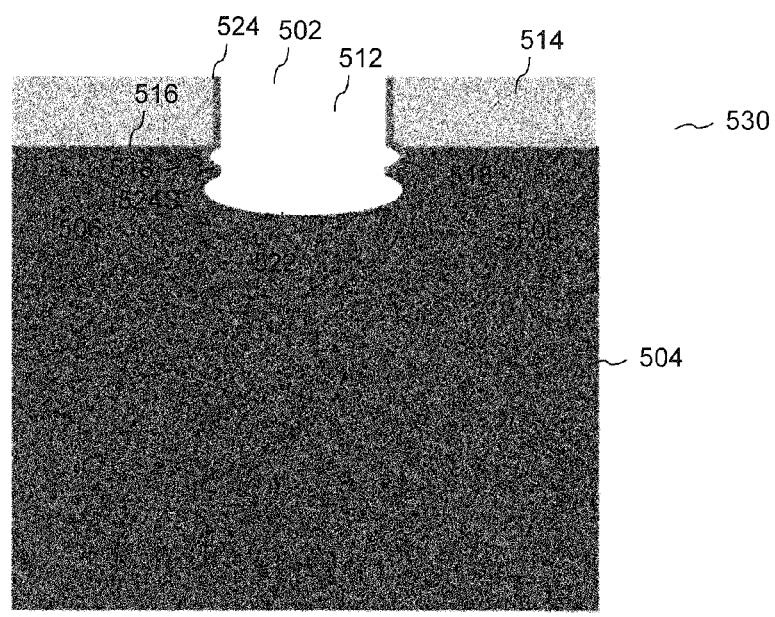

As shown in FIG. 5C in a view 530, portion 524B (which was shown in view 520 of FIG. 5B) of passivation material 524 and further carrier material exposed by the selective removal of the passivation material 524, e.g. of portion 524B, may be selectively removed. Selectively removing the portion 524B of the passivation material 524 and further carrier material may, for example, be achieved by wet etching and/or dry etching. As with the Bosch process, during etching, chemically reactive species and/or ions may be generated by electrical discharge in a reactive gas atmosphere. The reactive species and/or ions may include, for example, sulfur hexafluoride and/or argon or for example etchants gases which release fluorine, for example nitrogen trifluoride ($NF_3$) or tetrafluoromethane ($CF_4$). Etching and/or selective removal of portion 524B of passivation material 524 and carrier material exposed by the selective removal of the passivation material 524 may be achieved through the acceleration and/or bombardment of positively charged cations towards carrier 504.

Due to acceleration of cations towards portion 524B, portion 524B of passivation material 524 may be removed. Further portion 524S of passivation material 524, however, may be thinned, but may remain over at least one cavity side wall 518.

Figure 5D:
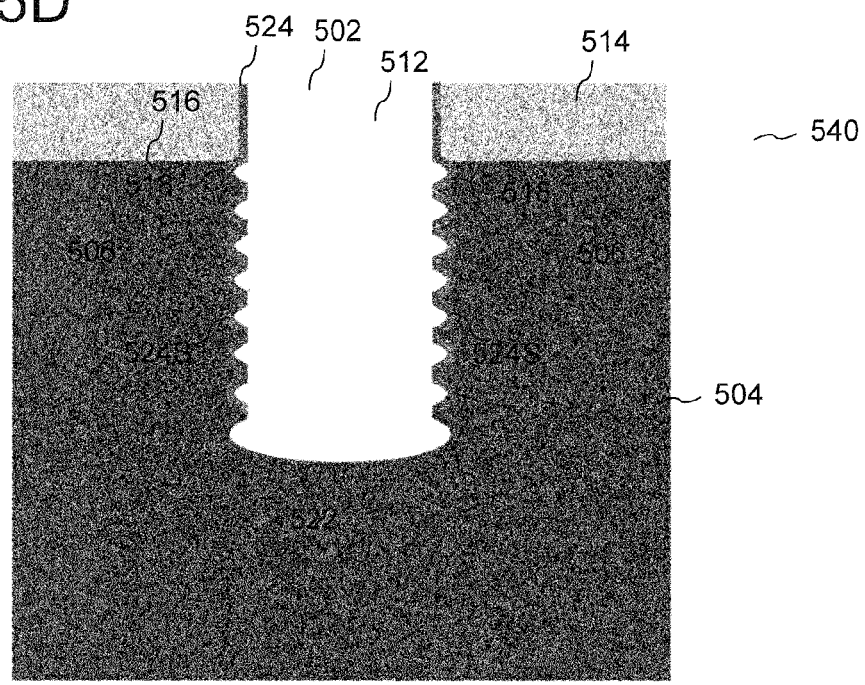

As shown in FIG. 5D in a view 540, method 500 may further include alternating between forming passivation material 524 and a selective removal process, i.e. etching. In other words, method 500 may further include alternating between:

forming passivation material 524 over one or more cavity walls 518, 522 exposed by the selective removal of the carrier material and selectively removing a portion 524B of the passivation material and further carrier material exposed by the selective removal of the passivation material 524.

These alternating processes may be repeated until a desired hole depth, i.e. depth of hole 502 is formed in the carrier 504. As further portion 524S of passivation material 524 may not be fully removed, and furthermore, as new passivation material 524 may be formed over at least one cavity side wall 518 until the desired hole depth is formed, a resulting further portion 524S of the passivation material 524 may remain over at least one cavity side wall 518 at the end of the hole formation process.

As with the Bosch Process, formation of passivation material 524 over one or more cavity walls 518, 522 and/or further portion 524S of passivation material 524 remaining over cavity side walls 518, may be carried out using a polymerization process using a mixture of gasses. For example, trifluoromethane ($CHF_3$) and/or argon or mixtures based on perfluorinated aromatic substances, e.g. styrene-like monomers or fluorine compounds may be used. Surfaces, such as cavity bottom wall 522 and/or further portion 524S of passivation material 524 formed over cavity side walls 518, exposed during polymerization, may be newly coated with passivation material 524. Passivation material 524 may include a polymer. For example, passivation material 524 may include Teflon-like polymer, which may for example be formed out of gases such as $C_4F_8$ and/or $CF_4$.

In a normal Bosch process, the polymer layer may be removed at the end of the process.

Figure 5E:
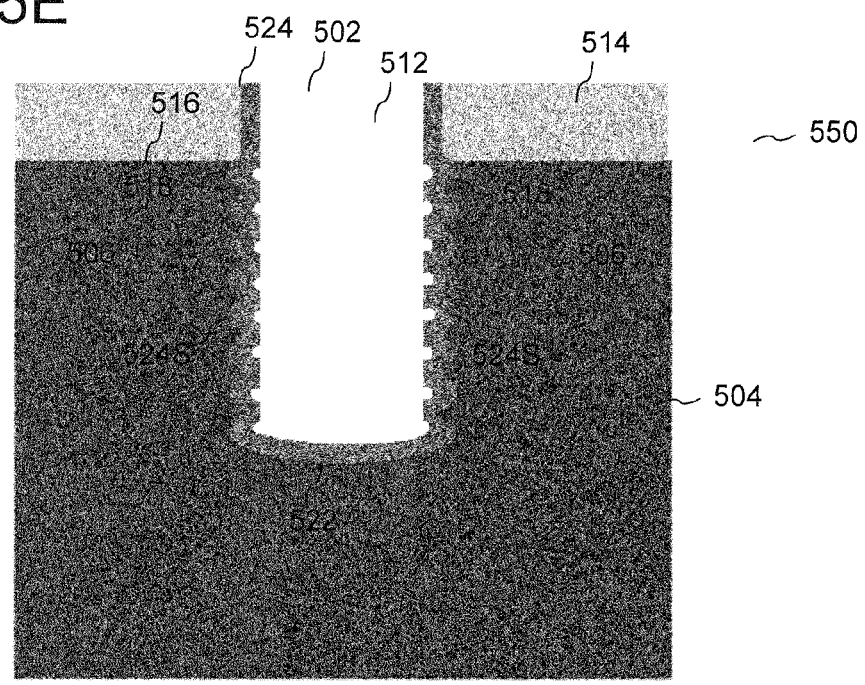

As shown in FIG. 5E in a view 550, the process for the formation of hole 502 may be carried out wherein the process of forming hole 502 which includes alternating between forming passivation material 524 and a selective removal process, may be carried out such that the final process of these alternating processes is the formation of passivation material 524, i.e. a polymerization process.

Therefore, passivation material 524 may be formed over cavity side walls 518, and passivation material 524 may even be formed over cavity bottom wall 522 in addition to over cavity side walls 518, in particular, if hole 502 does not fully penetrate carrier 504. Passivation material 524, in particular passivation layer 524S formed over cavity side walls 518, may optionally be thickened to a thickness of at least about 100 nm, e.g. greater than or equal to about 100 nm, e.g. greater than or equal to about 150 nm, e.g. greater than or equal to about 200 nm, e.g. greater than or equal to about 250 nm, e.g. greater than or equal to about 300 nm, e.g. greater than or equal to about 350 nm, e.g. greater than or equal to about 400, e.g. greater than or equal to about 450, e.g. greater than or equal to about 500 nm. For example, passivation layer 524S formed over cavity side walls 518 may optionally be thickened to obtain a thickness ranging from about 100 nm to about 800 nm in accordance with one embodiment, e.g. ranging from about 500 nm to about 800 nm in accordance with one embodiment. It may however be understood that passivation layer 524S may not be limited to these thicknesses and may include other thicknesses according to other embodiments. A thickening process may be carried out to increase the thickness of passivation material 524. For example, the polymerization process may be the final process of the alternating processes described above, and, in accordance with one embodiment, a further polymerization process may be carried out for additional time, or, in accordance with another embodiment, the deposition time (e.g. polymerization time) of the final polymerization process may be extended in comparison to the deposition time of each of the polymerization processes carried out during the alternating sequence described previously. The deposition time of the final polymerization process in combination with the deposition time of the further polymerization process, or the deposition time of the extended final polymerization process, may be longer than deposition times (e.g. polymerization times) used for conventional Bosch processes. For example, a deposition time of the final polymerization process in combination with the further polymerization process, or a deposition time of the extended final polymerization process, may be such that the final passivation layer is thickened to, or formed with, a thickness which is larger than a thickness of the final passivation layer obtained in conventional Bosch processes. For example, in accordance with some embodiments, the thickness may be at least twice the thickness obtained in conventional Bosch processes. For example, the thickness of the final passivation layer may be at least about 100 nm in accordance with some embodiments, e.g. greater than or equal to about 100 nm, e.g. greater than or equal to about 150 nm, e.g. greater than or equal to about 200 nm, e.g. greater than or equal to about 250 nm, e.g. greater than or equal to about 300 nm, e.g. greater than or equal to about 350 nm, e.g. greater than or equal to about 400, e.g. greater than or equal to about 450, e.g. greater than or equal to about 500 nm, e.g. in the range from about 100 nm to 800 nm in accordance with one embodiment, e.g. in the range from about 500 nm to about 800 nm in accordance with one embodiment, as described above, although other thicknesses, e.g. larger than 800 nm, may be possible as well in accordance with other embodiments.

Figure 5F:
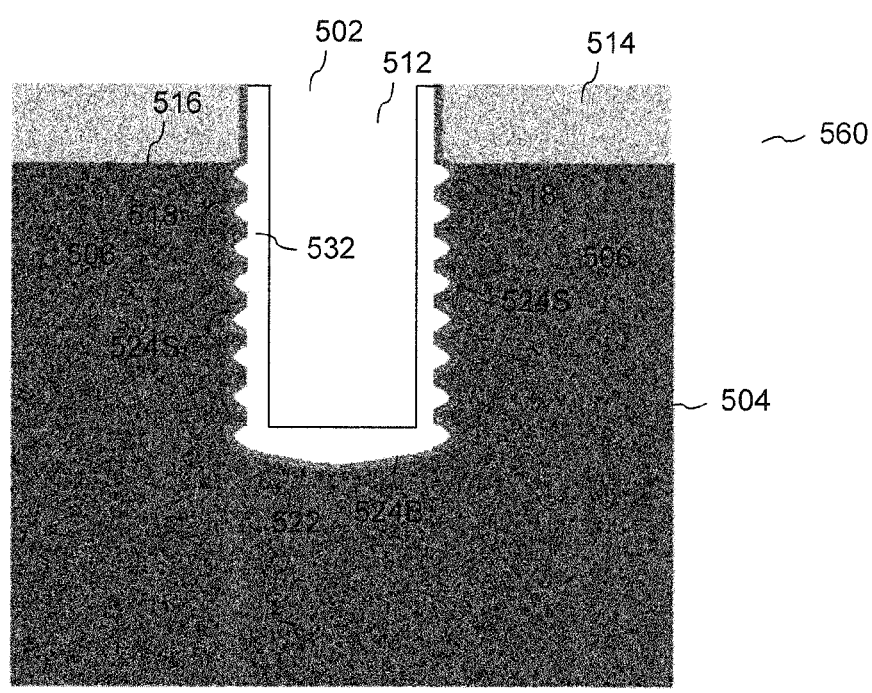

As shown in FIG. 5F in a view 560, method 500 may further include subsequently forming at least one layer 532 over further portion 524S of passivation material 524 remaining over at least one cavity side wall 518. It may be understood that further portion 524S of passivation material 524 may have optionally already been thickened in accordance with a thickening process described with respect to FIG. 5E. According to other embodiments however, it is possible that layer 532 may be formed over further portion 524S of passivation material 524 not thickened with the thickening process described with respect to FIG. 5E. According to various embodiments, layer 532 may include or consist of a package material (See FIG. 7). According to various embodiments, layer 532 may include or consist of an electrically insulating material. For example, according to some embodiments in FIG. 7. According to various embodiments, layer 532 may include or consist of an electrically conductive material (See FIG. 8). According to various embodiments, layer 532 may include or consist of a thermally conductive material (For example, according to some embodiments in FIG. 8). Forming hole 502 in carrier 504 may include forming hole 502 through carrier 504 wherein at least one chip 506 or plurality of chips 506 may be separated, partially or completely, from carrier 504. In other words, carrier material may be removed from at least one region between a plurality of chips 506 from carrier 504 including the plurality of chips 506 to separate the plurality of chips 506.

According to some embodiments, method 500 may be carried out for forming a chip arrangement such as a chip package, by individualizing a plurality of chips from each other, and passivating the chips on the sidewalls. According to other embodiments, method 500 for forming a chip arrangement may be carried out to form a through-hole via (e.g. a through-silicon via) through carrier 504.

Figure 6A:
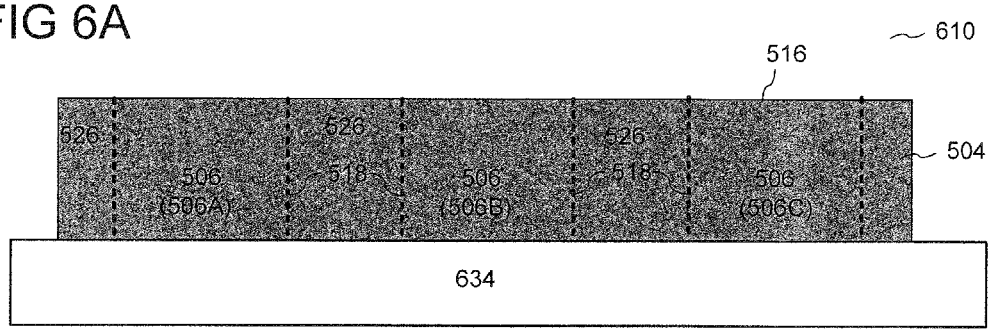
FIGS. 6A to 6D show cross-sectional views illustrating a method for manufacturing a chip arrangement according to an embodiment.
Figure 6B:
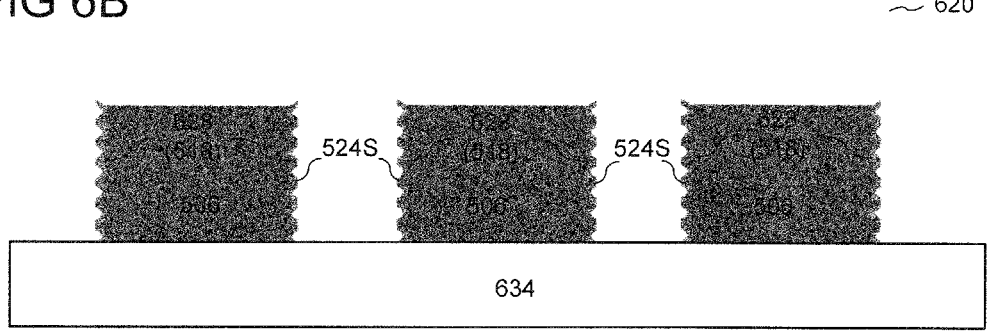
Figure 6C:
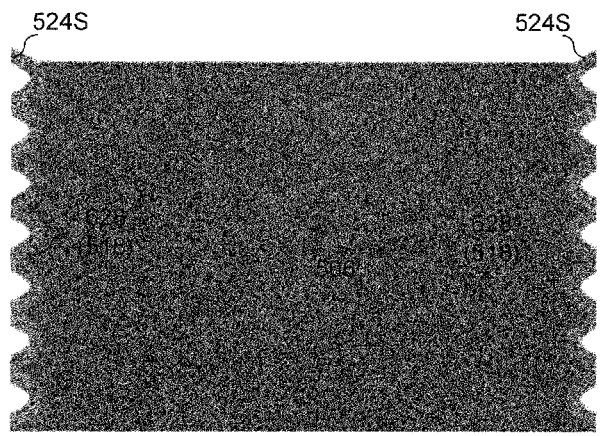

FIGS. 6A to 6C show cross-sectional views illustrating a method 600 for manufacturing a chip arrangement, e.g. a chip package, according to an embodiment. Method 600 may include one or more or all of the features already described with respect to method 500.

As shown in FIG. 6A in a view 610, carrier 504 may include a wafer, e.g. a substrate including a plurality of chips and/or dies 506. Unwanted regions 526, e.g. kerf regions, may be present in regions between the plurality of chips and/or dies 506, for example between first chip 506A and second chip 506B and/or between second chip 506B and third chip 506C.

As shown in FIG. 6B in a view 620, method 500 as described for forming holes, with respect to FIGS. 5A to 5D may be carried out to remove unwanted regions 526 from carrier 504.

Method 600 may include: individualizing the plurality of chips 506 from carrier 504 including the plurality of chips 506.

As described with respect to method 500, individualizing the plurality of chips 506 may include: removing carrier material between the plurality of chips 506 at a carrier surface, e.g. top side 516. Subsequently, individualizing the plurality of chips 506 may include:

forming passivation material 524 over portions of carrier 504 exposed by the removal of carrier material, and etching at least one portion 524B of passivation material 524 and carrier material exposed by the etching of the at least one portion 524B of passivation material 524.

Remaining passivation material 524S, which may remain over side walls 628, may protect side walls 628 of the plurality of chips 506 from the etching. For example, remaining passivation material 524S may protect side walls 628 against in-diffusion from foreign materials.

It may be understood that similarly to method 500, individualizing of the plurality of chips 506 may include alternating between forming passivation material 524 over portions of the carrier 504 exposed by the removal of carrier material, and a removal process which selectively removes, e.g. by etching, at least one portion 524B of passivation material 524 and carrier material exposed by the etching of at least one portion 524B of passivation material 524, until the plurality of chips 506 are separated from each other, for example as shown in FIG. 6B.

It may be understood that processes already described with respect to methods 500 and 600 may be carried out at wafer level, in other words, they may be carried out on carrier 504, e.g. a substrate, e.g. a wafer, including the plurality of chips 506.

Batch processing of individualized chips may be aided through the adhesion of carrier 504 to temporary carrier 634. It may be understood that even if chips 506 were individualized from each other, e.g. as shown in FIG. 6B, subsequent processes may optionally be carried out individually, or in batch processes. As a result, even individualized chips 506, i.e. without carrier material between chip sidewalls of neighboring chips, may still be commonly held by temporary carrier 634 and furthermore, processed together without having to be individually handled.

As at least one cavity side wall 518 may include a side wall 628 of at least one chip 506, passivation material 524S not removed by the removal process may be formed and/or remain over side walls 628 of the plurality of chips 506.

Passivation material 524S may optionally be thickened using a thickening process as described with respect to FIG. 5E.

The plurality of chips 506 may be individualized as a consequence of the formation of channel and/or hole 502 in carrier 504, which may separate the plurality of chips 506, e.g. first chip 506A from second chip 506B and/or second chip 506B from third chip 506C. A chip arrangement, e.g. chip package, may be manufactured by method 600 as described according to FIGS. 6A and 6B. As shown in FIG. 6C in a view 630, the chip arrangement may include chip 506; passivation layer 524S formed over at least one side wall 628 of chip 506. The thickness of the passivation layer 524S remaining over the channel side walls, e.g. cavity side walls 518, of channel 502 formed through carrier 504 may be at least about 100 nm in accordance with some embodiments. For example, passivation layer 524S may include a thickness of greater than or equal to about 100 nm, e.g. greater than or equal to about 150 nm, e.g. greater than or equal to about 200 nm, e.g. greater than or equal to about 250 nm, e.g. greater than or equal to about 300 nm, e.g. greater than or equal to about 350 nm, e.g. greater than or equal to about 400, e.g. greater than or equal to about 450, e.g. greater than or equal to about 500 nm, e.g. ranging from about 100 nm to about 800 nm in accordance with one embodiment, e.g. ranging from about 500 nm to about 800 nm according to one embodiment. It may however be understood that passivation layer 524S may not be limited to these thicknesses and may include other thicknesses according to other embodiments. According to an embodiment, passivation layer 524S may include a polymer material.

Figure 6D:
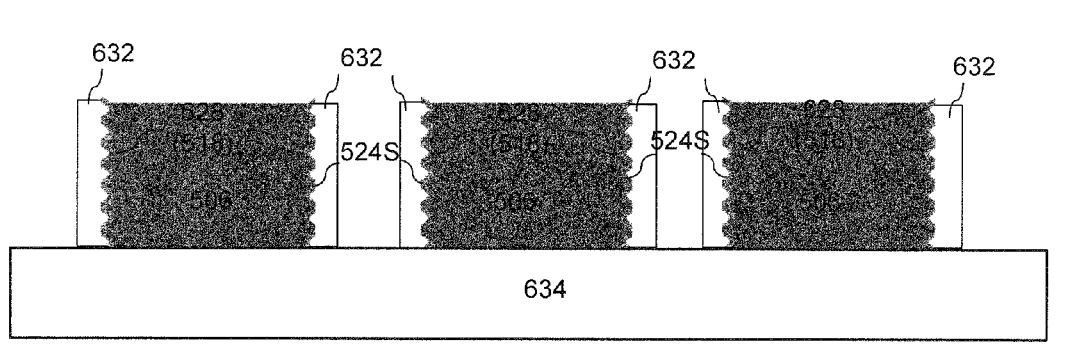

As shown in FIG. 6D, method 600 may further include forming at least one layer 632 over remaining passivation material 524S. The formation of at least one layer 632 may be analogous to the formation of layer 532. At least one layer 632 and remaining passivation material 524S may form part of a resulting chip package, e.g. chip package 640 shown in FIG. 6D.

Figure 7:
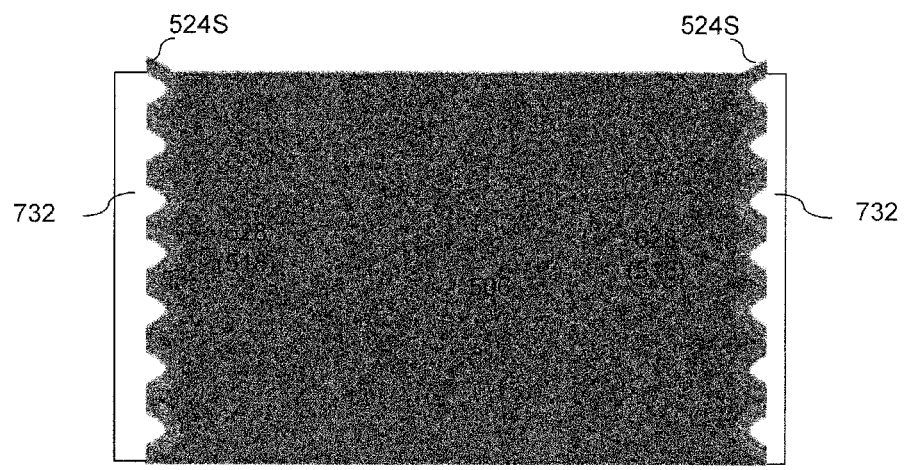
FIG. 7 shows a chip arrangement according to an embodiment.

As shown in FIG. 7, chip arrangement 710, which may include and/or be a chip package, may be manufactured according to processes described according to methods 500 and 600. As shown in FIG. 7, chip arrangement 710 may include chip 506; passivation layer 524S formed over at least one side wall 628 of chip 506, and package material 732 formed over passivation layer 524S.

According to various embodiments, passivation layer 524S may include a polymer material. According to some embodiments, passivation layer 524S may have a thickness of at least about 100 nm, e.g. greater than or equal to about 100 nm, e.g. greater than or equal to about 150 nm, e.g. greater than or equal to about 200 nm, e.g. greater than or equal to about 250 nm, e.g. greater than or equal to about 300 nm, e.g. greater than or equal to about 350 nm, e.g. greater than or equal to about 400, e.g. greater than or equal to about 450, e.g. greater than or equal to about 500 nm. For example, passivation layer 524S may have a thickness ranging from about 100 nm to about 800 nm in accordance with one embodiment, e.g. ranging from about 500 nm to about 800 nm in accordance with one embodiment. It may however be understood that passivation layer 524S may not be limited to these thicknesses and may include other thicknesses according to other embodiments. Passivation layer 524S may be analogous to remaining passivation material 524S formed during individualization of chips 506 as described above.

According to various embodiments, package material 732 may include a chip packaging material. For example, package material 732 may include at least one material from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

It may be understood that the formation of package material 732 may be analogous to the formation of at least one layer 632. Therefore, package material 732 may be analogous to layers 532 and/or 632 described with respect to methods 500 and/or 600.

Figure 8:
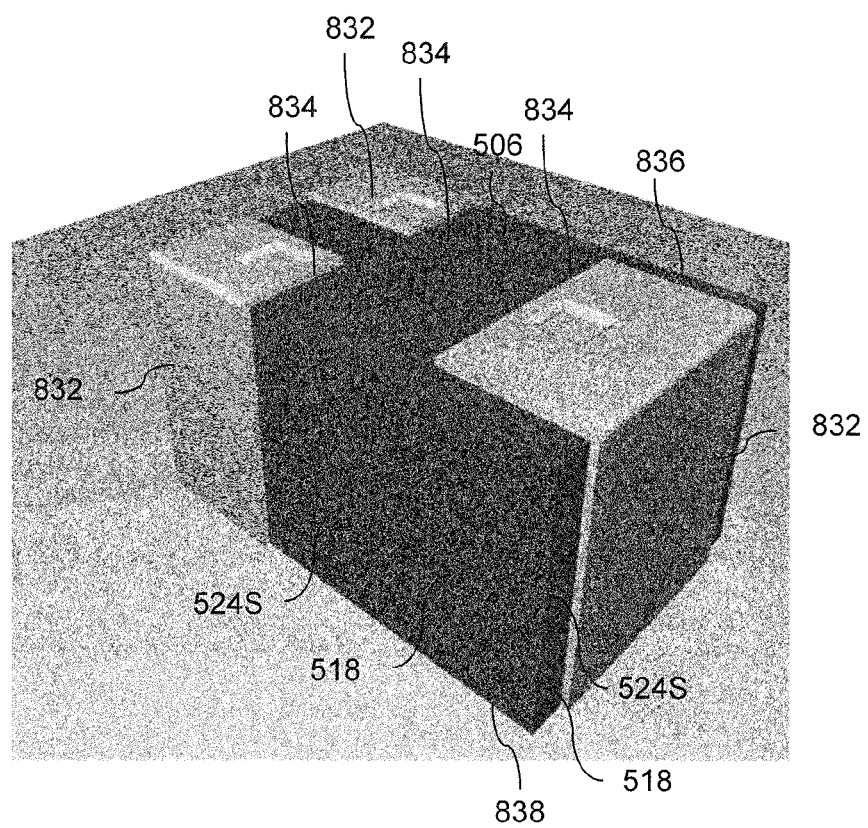
FIG. 8 shows a chip package according to an embodiment.

As shown in FIG. 8, chip arrangement 810, which may include and/or be a chip package, may be manufactured according to processes described according to methods 500 and 600. As with method 500 and 600, at least one layer 832 may be disposed over remaining passivation material 524S and both layer 832 and passivation material 524S may form part of an eventual chip arrangement and/or package.

Wherein FIG. 7 describes various embodiments wherein at least one layer 532 may include package material 732, FIG. 8 describes various embodiments wherein at least one layer 532 may include at least one contact 832, e.g. an electrical contact.

As shown in FIG. 8, chip package 810 may include chip 506 including at least one chip contact 834. Passivation layer 524S may be formed over at least one side wall 518 of chip 506. At least one contact 832 may be formed over passivation layer 524S, wherein at least one contact 832 may be in electrical connection with at least one chip contact 834.

According to various embodiments, chip package 810 may include and/or form part of a system-in package integrated circuit arrangement, for example an efficient silicon multi-chip system-in-package (ESIPAC) arrangement.

According to various embodiments, passivation layer 524S may electrically insulate at least one contact 832 from at least one side wall 518 of chip 506. In accordance with various embodiments, passivation layer 524S may include a polymer material. Passivation layer 524S may include a thickness of at least about 100 nm in accordance with some embodiments, for example a thickness greater than or equal to about 100 nm, e.g. greater than or equal to about 150 nm, e.g. greater than or equal to about 200 nm, e.g. greater than or equal to about 250 nm, e.g. greater than or equal to about 300 nm, e.g. greater than or equal to about 350 nm, e.g. greater than or equal to about 400, e.g. greater than or equal to about 450, e.g. greater than or equal to about 500 nm, e.g. ranging from about 100 nm to about 800 nm in accordance with one embodiment, e.g. ranging from about 500 nm to about 800 nm in accordance with one embodiment. It may however be understood that passivation layer 524S may not be limited to these thicknesses and may include other thicknesses according to other embodiments.

According to various embodiments, at least one chip contact 834, e.g. which may be a plurality of chip contacts 834, may be referred to as at least one chip contact pad, e.g. an electrically conductive chip contact pad. At least one chip contact 834 may be formed over a side of chip 506, e.g. over a top side 836 and/or a bottom side 838 of chip 506. If more than one chip contact 834 is disposed over top side 836 of chip 506, the more than one chip contacts 834 may be electrically insulated from each other, for example, by electrically insulating material such as, for example, Silicon Nitride. At least one chip contact 834 may include or consist of at least one material, element or alloy from the following group of materials, the group consisting of: copper, aluminum, silver, tin, gold, palladium, zinc, nickel, iron. According to other embodiments, at least one chip contact 834 may include or consist of other materials, elements or alloys. According to various embodiments, at least one contact 832, which may be a plurality of contacts 832, may include an electrically conductive layer, e.g. a metal sheet and/or foil, which may be formed over at least part of passivation layer 524S. At least one contact 832 may include or consist of at least one material, element or alloy from the following group of materials, the group consisting of: copper, aluminum, silver, tin, gold, palladium, zinc, nickel, iron.

For a chip package such as chip package 810, it may be possible that no further package materials, such as mold materials may be deposited over at least one contact 832. Therefore, passivation of chip side walls 518 by chip passivation layer 524S may protect the side walls 518 and electrically insulate the contacts 832 from each other and from the body of chip 506.

Figure 9:
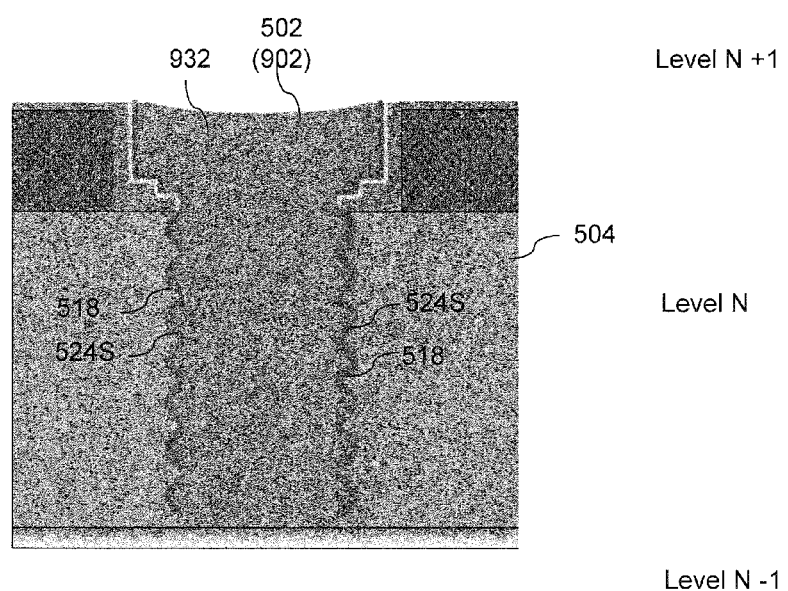
FIG. 9 shows a chip arrangement according to an embodiment.

FIG. 9 shows chip arrangement 910 according to an embodiment. As shown in chip arrangement 910, forming hole 502 in carrier 504 may include forming a through-hole via 902 through carrier 504.

According to various embodiments, through-hole via 902 may be formed as described according to method 500. FIG. 9 describes various embodiments wherein forming at least one layer 532 over the further portion 524S of passivation material 524 may include at least partially filling through-hole via 902 with further material 932.

According to various embodiments, further material 932 may be separated from at least one cavity side wall 518 by passivation material 524 or further portion 524S of passivation material 524 remaining on at least one cavity side wall 518.

According to various embodiments, further material 932 may at least partially fill through-hole via 902. Further material 932 may include an electrically conductive material, e.g. electrically conductive materials which may be used for forming electrical interconnects. Such electrically conductive materials may include metals. For example, further material 932 may include at least one material, element or alloy from the following group of materials, the group consisting of: copper, aluminum, silver, tin, gold, palladium, zinc, nickel, iron.

According to various embodiments, further material 932 may be electrically insulated from carrier 504 by passivation material, e.g. further portion 524S of passivation material 524. Further material 932 may include a through silicon via interconnect, and may be electrically connected to at least one chip contact pad (not shown). Carrier 504 may include chip 506, which may include one or more electronic devices and/or electrical circuits formed in carrier 504. Carrier 504 including chip 506 may form part of a layered chip-stack arrangement. For example, carrier 504 and chip 506 may be disposed in level N of a layered chip-stack arrangement. Further material 932 may include a through silicon via interconnect, which may be formed through carrier 504, for example through through-hole 902. Further material 932 may electrically connect an electrical device in level N+1 of the layered chip-stack arrangement to at least of an electronic device disposed in level N of the layered chip-stack arrangement and/or to an electronic device disposed in level N−1 of the layered chip-stack arrangement.

Various embodiments provide a method for manufacturing a chip arrangement, the method including: forming a hole in a carrier including at least one chip, wherein forming a hole in the carrier includes: selectively removing carrier material, thereby forming a cavity in the carrier, forming passivation material over one or more cavity walls exposed by the selective removal of the carrier material; selectively removing a portion of the passivation material and further carrier material exposed by the selective removal of the passivation material, wherein a further portion of the passivation material remains over at least one cavity side wall; the method further including subsequently forming a layer over the further portion of passivation material remaining over the at least one cavity side wall.

According to an embodiment, the carrier includes a semiconductor substrate.

According to an embodiment, the carrier includes a silicon substrate.

According to an embodiment, forming a hole in the carrier includes forming the hole through the carrier wherein the at least one chip is separated from the carrier.

According to an embodiment, the at least one cavity side wall includes a side wall of the at least one chip.

According to an embodiment, forming passivation material over one or more cavity walls includes forming a polymer material over the one or more cavity walls.

According to an embodiment, selectively removing a portion of the passivation material and further carrier material includes selectively removing the portion of the passivation material and the further carrier material by at least one of chemical etching or plasma etching.

According to an embodiment, forming a hole in the carrier includes forming a through-hole via through the carrier, and forming a layer over the further portion of passivation material includes at least partially filling the through-hole via with further material.

According to an embodiment, the further material is separated from at least one cavity side wall by the passivation material.

According to an embodiment, the further material includes electrically conductive material.

According to an embodiment, the method further includes electrically connecting the further material to at least one chip contact pad; wherein the further material is electrically insulated from the carrier by the passivation material.

According to an embodiment, forming a layer over the further portion of passivation material includes forming further passivation material over the further portion of the passivation material remaining over the at least one cavity side wall.

According to an embodiment, the method further includes alternating between forming passivation material over one or more cavity walls exposed by the selective removal the carrier material and selectively removing a portion of the passivation material and further carrier material exposed by the selective removal of the passivation material, wherein a further portion of the passivation material remains over at least one cavity side wall; until a desired hole depth is formed in the carrier.

Various embodiments provide a method for manufacturing a chip package, the method including: individualizing a plurality of chips from a carrier including the plurality of chips, wherein individualizing the plurality of chips includes: removing carrier material between the plurality of chips at a carrier surface; forming passivation material over portions of the carrier exposed by the removal of carrier material, and etching at least one portion of the passivation material and carrier material exposed by the etching of the at least one portion of passivation material; wherein remaining passivation material protects side walls of the plurality of chips from the etching; the method further including forming at least one layer over the remaining passivation material; the at least one layer and the remaining passivation material forming part of the chip package.

According to an embodiment, the individualizing of the plurality of chips further includes alternating between forming passivation material over portions of the carrier exposed by the removal of carrier material, and etching at least one portion of the passivation material and carrier material exposed by the etching of the at least one portion of passivation material; wherein remaining passivation material protects side walls of the plurality of chips from the etching; until the plurality of chips are separated from each other.

According to an embodiment, the carrier includes a semiconductor substrate.

According to an embodiment, forming passivation material over portions of the carrier exposed by the removal of carrier material includes forming a polymer material over portions of the carrier exposed by the removal of carrier material.

According to an embodiment, etching at least one portion of the passivation material and carrier material exposed by the etching of the at least one portion of passivation material includes etching at least one portion of the passivation material and carrier material exposed by the etching of the at least one portion of passivation material by at least one of chemical etching or plasma etching.

Various embodiments provide a method for manufacturing a chip package, the method including: removing carrier material from at least one region between a plurality of chips from a carrier including the plurality of chips to separate the plurality of chips; wherein removing the carrier material includes: alternating between forming passivation material over portions of the carrier exposed by the removal of carrier material, and a removal process which selectively removes a portion of the passivation material and further carrier material exposed by the selective removal of the passivation material, wherein passivation material not removed by the removal process is formed over the side walls of the plurality of chips; the method further including forming at least one layer over passivation material that remains after the plurality of chips have been separated; the at least one layer and the remaining passivation material forming part of the chip package.

Various embodiments provide a method for manufacturing a chip arrangement, the method including: forming a channel through a carrier including a first chip and a second chip, the channel separating the first chip from the second chip, wherein forming the channel through the carrier includes: forming a channel opening by selectively removing carrier material between the first chip and the second chip; and alternating between forming passivation material over portions of the carrier exposed by the selective removal of carrier material, and selectively removing a portion of the passivation material and further carrier material exposed by the selective removal of the passivation material, wherein a further portion of the passivation material remaining over side walls of the channel; until the channel is formed through the carrier; wherein the passivation material remaining over the side walls of the channel formed through the carrier may be thickened to a thickness of at least about 100 nm.

Various embodiments provide a chip arrangement, including a chip; a passivation layer formed over at least one side wall of the chip, and package material formed over the passivation layer.

According to an embodiment, the passivation layer includes a polymer material.

According to an embodiment, the passivation layer may be thickened to a thickness of at least about 100 nm.

Various embodiments provide a chip arrangement, including a chip; a passivation layer formed over at least one side wall of the chip, wherein the passivation layer includes a thickness of at least about 100 nm.

According to an embodiment, the passivation layer includes a polymer material.

Various embodiments provide a chip package, including a chip including at least one chip contact; a passivation layer formed over at least one side wall of the chip, at least one contact formed over the passivation layer, wherein the at least one contact is in electrical connection with the at least one chip contact.

According to an embodiment, the passivation layer electrically insulates the at least one contact from at least one side wall of the chip.

According to an embodiment, the passivation layer includes a polymer material.

According to an embodiment, the passivation layer includes a thickness of at least about 100 nm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip arrangement, the method comprising:
    forming a hole in a carrier comprising at least one chip, wherein forming a hole in the carrier comprises:
        selectively removing carrier material, thereby forming a cavity in the carrier, forming passivation material over one or more cavity walls exposed by the selective removal of the carrier material;
        selectively removing a portion of the passivation material and further carrier material exposed by the selective removal of the passivation material, wherein a further portion of the passivation material remains over at least one cavity side wall, wherein forming the hole in the carrier comprises forming the hole through the carrier wherein the at least one chip is separated from the carrier, and wherein the at least one cavity side wall comprises a side wall of the at least one chip;
    the method further comprising subsequently forming a layer over the further portion of passivation material remaining over the at least one cavity side wall.

2. The method according to claim 1, wherein the carrier comprises a semiconductor substrate.

3. The method according to claim 1, wherein the carrier comprises a silicon substrate.

4. The method according to claim 1, wherein forming passivation material over one or more cavity walls comprises forming a polymer material over the one or more cavity walls.

5. The method according to claim 1, wherein selectively removing a portion of the passivation material and further carrier material comprises selectively removing the portion of the passivation material and the further carrier material by at least one of wet etching or dry etching.

6. The method according to claim 1, wherein forming a layer over the further portion of passivation material comprises forming further passivation material over the further portion of the passivation material remaining over the at least one cavity side wall.

7. The method according to claim 1, further comprising alternating between
    forming passivation material over one or more cavity walls exposed by the selective removal the carrier material and
    selectively removing a portion of the passivation material and further carrier material exposed by the selective removal of the passivation material, wherein a further portion of the passivation material remains over at least one cavity side wall;
until a desired hole depth is formed in the carrier.

8. A method for manufacturing a chip package, the method comprising:
    individualizing a plurality of chips from a carrier comprising a plurality of chips, wherein individualizing the plurality of chips comprises:
    removing carrier material between the plurality of chips at a carrier surface;
    forming passivation material over portions of the carrier exposed by the removal of carrier material, and
    etching at least one portion of the passivation material and carrier material exposed by the etching of the at least one portion of passivation material; wherein remaining passivation material protects side walls of the plurality of chips from the etching;
    the method further comprising
    forming at least one layer over the remaining passivation material; the at least one layer and the remaining passivation material forming part of the chip package.

9. The method according to claim 8, the individualizing of the plurality of chips further comprises alternating between
    forming passivation material over portions of the carrier exposed by the removal of carrier material, and
    etching at least one portion of the passivation material and carrier material exposed by the etching of the at least one portion of passivation material; wherein remaining passivation material protects side walls of the plurality of chips from the etching;
until the plurality of chips are separated from each other.

10. The method according to claim 8, wherein the carrier comprises a semiconductor substrate.

11. The method according to claim 8, wherein forming passivation material over portions of the carrier exposed by the removal of carrier material comprises forming a polymer material over portions of the carrier exposed by the removal of carrier material.

12. The method according to claim 1, wherein etching at least one portion of the passivation material and carrier material exposed by the etching of the at least one portion of passivation material comprises etching at least one portion of the passivation material and carrier material exposed by the etching of the at least one portion of passivation material by at least one of chemical etching or plasma etching.

13. A method for manufacturing a chip package, the method comprising:
- removing carrier material from at least one region between a plurality of chips from a carrier comprising the plurality of chips to separate the plurality of chips;
- wherein removing the carrier material comprises: alternating between
  - forming passivation material over portions of the carrier exposed by the removal of carrier material, and
  - a removal process which selectively removes a portion of the passivation material and further carrier material exposed by the selective removal of the passivation material, wherein passivation material not removed by the removal process is formed over the side walls of the plurality of chips;
- the method further comprising
- forming at least one layer over passivation material that remains after the plurality of chips have been separated; the at least one layer and the remaining passivation material forming part of the chip package.

14. A method for manufacturing a chip arrangement, the method comprising:
- forming a channel through a carrier comprising a first chip and a second chip, the channel separating the first chip from the second chip,
- wherein forming the channel through the carrier comprises:
  - forming a channel opening by selectively removing carrier material between the first chip and the second chip; and alternating between
  - forming passivation material over portions of the carrier exposed by the selective removal of carrier material, and
  - selectively removing a portion of the passivation material and further carrier material exposed by the selective removal of the passivation material, wherein a further portion of the passivation material remains over side walls of the channel; until the channel is formed through the carrier;
- wherein the passivation material remaining over the side walls of the channel formed through the carrier is thickened to at least about 100 nm, and wherein the side walls of the channel correspond to side walls of the first chip and the second chip.

\* \* \* \* \*